(12) United States Patent
Goel

(10) Patent No.: US 7,277,353 B2
(45) Date of Patent: Oct. 2, 2007

(54) REGISTER FILE

(75) Inventor: Rajat Goel, Santa Clara, CA (US)

(73) Assignee: P.A. Semi, Inc., Santa Clara, CA (US)

(*) Notice: Subject to any disclaimer, the term of this patent is extended or adjusted under 35 U.S.C. 154(b) by 106 days.

(21) Appl. No.: 11/208,912

(22) Filed: Aug. 22, 2005

(65) Prior Publication Data

US 2007/0041262 A1 Feb. 22, 2007

(51) Int. Cl.
*G11C 8/00* (2006.01)

(52) U.S. Cl. ............................ 365/230.05; 365/189.01

(58) Field of Classification Search ........... 365/230.05, 365/189.01, 231
See application file for complete search history.

(56) References Cited

U.S. PATENT DOCUMENTS

| | | | |
|---|---|---|---|
| 5,299,158 A | | 3/1994 | Mason et al. |
| 5,671,187 A | * | 9/1997 | Childers et al. ............ 365/205 |
| 5,828,623 A | * | 10/1998 | Dilbeck ................. 365/230.05 |
| 5,894,432 A | | 4/1999 | Lotfi |
| 5,923,608 A | | 7/1999 | Payne |
| 6,038,192 A | * | 3/2000 | Clinton et al. ......... 365/230.03 |
| 6,038,274 A | | 3/2000 | Ribeiro Filho et al. |
| 6,163,473 A | * | 12/2000 | Hannum ....................... 365/49 |
| 6,172,894 B1 | * | 1/2001 | Hannum ....................... 365/49 |
| 6,333,894 B1 | * | 12/2001 | Nakayama et al. ......... 365/233 |
| 6,343,348 B1 | | 1/2002 | Tremblay et al. |
| 6,542,423 B1 | | 4/2003 | Kalyanasundharam et al. |
| 6,782,521 B2 | | 8/2004 | Iadonato et al. |
| 2006/0083074 A1 | | 4/2006 | Cottier et al. |

OTHER PUBLICATIONS

U.S. Appl. No. 11/208,911, filed Aug. 22, 2005, 33 pages.

* cited by examiner

*Primary Examiner*—Thong Q. Le
(74) *Attorney, Agent, or Firm*—Lawrence J. Merkel; Meyertons, Hood, Kivlin, Kowert & Goetzel, P.C.

(57) ABSTRACT

In one embodiment, a memory circuit comprises one or more first memory cells, each of the one or more first memory cells configured to store at least one bit; one or more second memory cells, each of the one or more second memory cells configured to store at least one bit; and one or more read port circuits physically located between the first memory cells and the second memory cells. Each of the read port circuits is coupled to receive the at least one bit from each of the first memory cells and each of the second memory cells, and each of the read port circuits is configured to output the at least one bit from a selected memory cell of the first memory cells and the second memory cells responsive to a plurality of wordline signals coupled to the read port circuit.

24 Claims, 5 Drawing Sheets

REGISTER FILE

BACKGROUND

1. Field of the Invention

This invention is related to the field of register files and other memory circuits.

2. Description of the Related Art

Register files and other memory circuits are used as storage for a wide variety of purposes in integrated circuits. For example, in processors, register files may be used to implement various sets of architected registers (that is, registers specified in the instruction set architecture implemented by the processor). Processors that implement register renaming or other speculative execution techniques may implement register files to store speculative register contents. Furthermore, register files may be used to implement queues, first-in first-out (FIFO) buffers, other buffers, state storage for various implementation-specific circuits, etc.

Standard register file/memory circuit design includes a set of memory cells arranged into one or more arrays of rows and columns. Each column of memory cells stores the same bit position of different array entries, and the rows form the entries. Multiple bits read from/written to an entry as a unit are often generically referred to as a "word" of the array. Thus, the control signals provided to the array to read/write an entry are referred to as "wordlines". Each column of memory cells are connected to a pair of bitlines for each read port and write port on the array. An address is provided on the read port, and the entry selected by that address has its wordline activated. The wordline controls two passgate transistors within the memory cell that connect the memory cell to the bitlines, and the memory cell develops a differential on the bitlines that represents the stored bit. A senseamplifier circuit detects the differential and amplifies it to provide the output bit from the column.

The bitlines in the standard design are typically long and highly capacitive, and precharging the bitlines and discharging them for reads consumes significant power. Each read port adds additional sets of bitlines, further increasing the power consumption. Furthermore, since the memory cells must sink charge to discharge one of the bitlines to develop the differential, adding read ports adds stress to the memory cell design. Adding read ports changes the design of the memory cell itself, since transistors must be added to connect the memory cell to more bitlines and more wordlines must be added to the cell. As read ports (and write ports) are increased in a given design, the amount of area required for a memory cell often increases and in many cases may be dominated by the area required to wire the wordlines and bitlines to the memory cells.

SUMMARY

In one embodiment, a memory circuit comprises one or more first memory cells, each of the one or more first memory cells configured to store at least one bit; one or more second memory cells, each of the one or more second memory cells configured to store at least one bit; and one or more read port circuits physically located between the first memory cells and the second memory cells. Each of the read port circuits is coupled to receive the at least one bit from each of the first memory cells and each of the second memory cells, and each of the read port circuits is configured to output the at least one bit from a selected memory cell of the first memory cells and the second memory cells responsive to a plurality of wordline signals coupled to the read port circuit. In some embodiments, the memory circuit is included in a register file in an integrated circuit that also comprises logic circuitry configured to generate an address for a read port the register file to read a location in the register file. The register file is coupled to receive the address on the read port, and furthers comprises wordline decode circuitry coupled to receive the address and configured to decode the address to generate the plurality of wordline signals.

BRIEF DESCRIPTION OF THE DRAWINGS

The following detailed description makes reference to the accompanying drawings, which are now briefly described.

Figure 1:
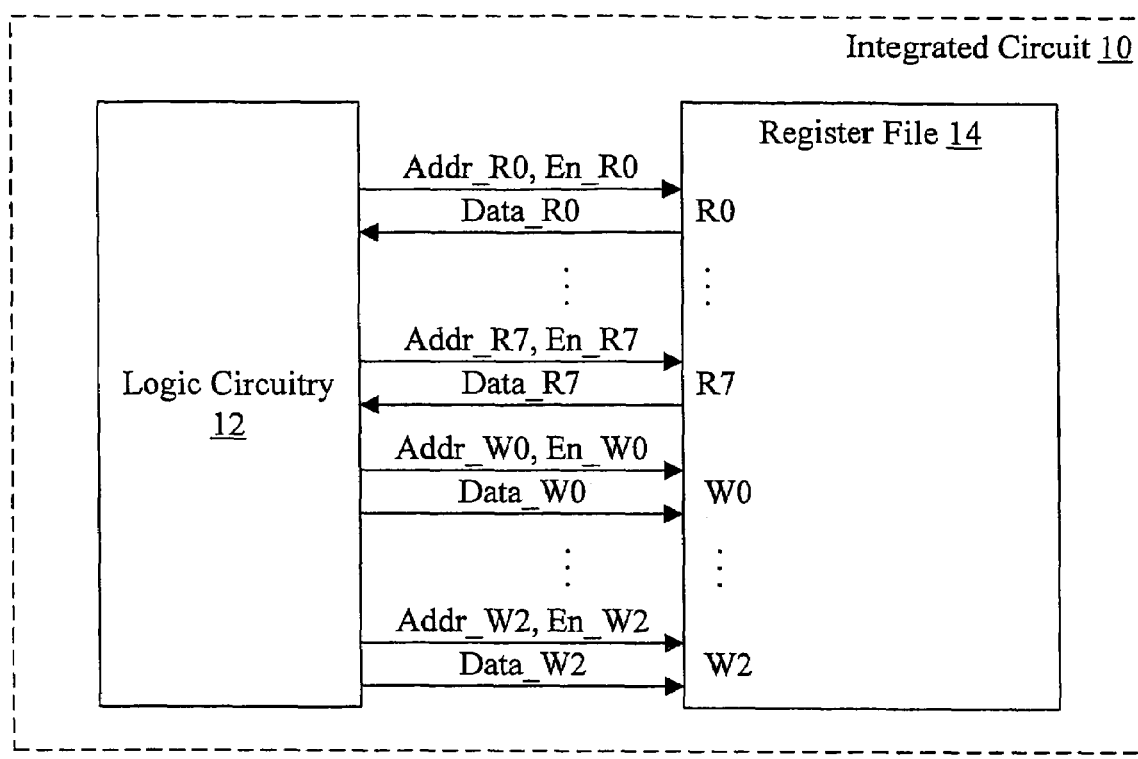
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit 10 is shown. In the embodiment of FIG. 1, the integrated circuit 10 includes logic circuitry 12 coupled to a register file 14. More particularly, the register file 14 has one or more read ports and one or more write ports. In FIG. 1, the read ports are illustrated as R0 to R7. Thus, in the illustrated embodiment, the register file 14 has 8 read ports. That is, eight values (or words) may be read from the register file 14 concurrently. In FIG. 1, the write ports are illustrated as W0 to W2. Thus, in the illustrated embodiment, the register file 14 has 3 write ports and up to 3 values (words) may be written to the register file 14 concurrently.

Each read port may include an address and an enable transmitted by the logic circuitry 12, and data returned by the register file 14. The address is denoted Addr_Rx, where "x" is the port number (0 to 7). Similarly, the enable is denoted En_Rx and the data is denoted Data_Rx. Each write port includes an address, an enable, and data transmitted by the logic circuitry 12. The address is denoted Addr_Wx, where "x" is the port number (0 to 2). Similarly, the enable is denoted En_Wx and the data is denoted Data_Wx.

The logic circuitry 12 thus performs a read of the register file 14 on one of the read ports (e.g. R0) by transmitting an address and asserting the enable on the read port (Addr_R0 and En_R0). The register file responds with the value from the addressed entry on Data_R0. Accordingly, the address provided on a read port (or write port) may comprise any value that is at least sufficient to uniquely identify an entry in the register file 14. For example, if the register file comprises entries that correspond to architected or speculative registers, the address may be a register number. The width of Data_R0 may be the width of an entry, which may be any desired width depending, e.g., on what values the register file 14 is storing. For example, if the register file 14 has entries corresponding to architected or speculative registers in a processor, the width of the entries may be the width of the registers (or wider, if additional status bits are stored with the register values).

The logic circuitry 12 performs a write to the register file 14 on one of the write ports (e.g. W0) by transmitting the address of the entry to be written, the data to be written to the entry, and asserting the enable (e.g. Addr_W0, Data_W0, and En_W0). As with the read ports, the width of the data (Data_W0) may be the width of the entry being written in the register file 14.

The logic circuitry 12 may generally comprise any circuitry which, in conjunction with the register file 14 and inputs/outputs of the integrated circuit 10 (not shown), implement the operation of the integrated circuit 10. Any set of desired functionality may be implemented, in various embodiments.

The register file 14 is illustrated in more detail for one embodiment in FIGS. 2-5, and may generally comprise a memory structure that includes a plurality of entries, each entry configured to store data. The entries are addressable using the read and write ports for reading and writing the entries, respectively. In some embodiments, a read/write of the register file 14 may occur in a clock cycle or less. In other embodiments, a read/write may be pipelined over two more clock cycles.

While the embodiment of FIG. 1 illustrates one register file 14, other embodiments may include additional register files. In some embodiments, one or more of the additional register files may have a similar design to the embodiments of the register file 14 described below. Furthermore, other memory circuits may implement a similar design to the embodiments below (e.g. other random access memory (RAM) circuits, content addressable memory (CAM) circuits, etc.). Generally, a memory circuit may comprise any circuit having one or more read ports and one or more write ports for reading/writing data values from/to entries in the memory circuit. A register file is one example of a memory circuit, along with other RAM circuits, CAM circuits, and any other memory circuitry. Accordingly, various embodiments of the integrated circuit 10 may include one or more memory circuits according to the embodiments described herein. The term register file will be used in the examples below, and the examples include 8 read ports and 3 write ports. However, other embodiments may be any memory circuit including any number of one or more read ports and one or more write ports.

Figure 2:
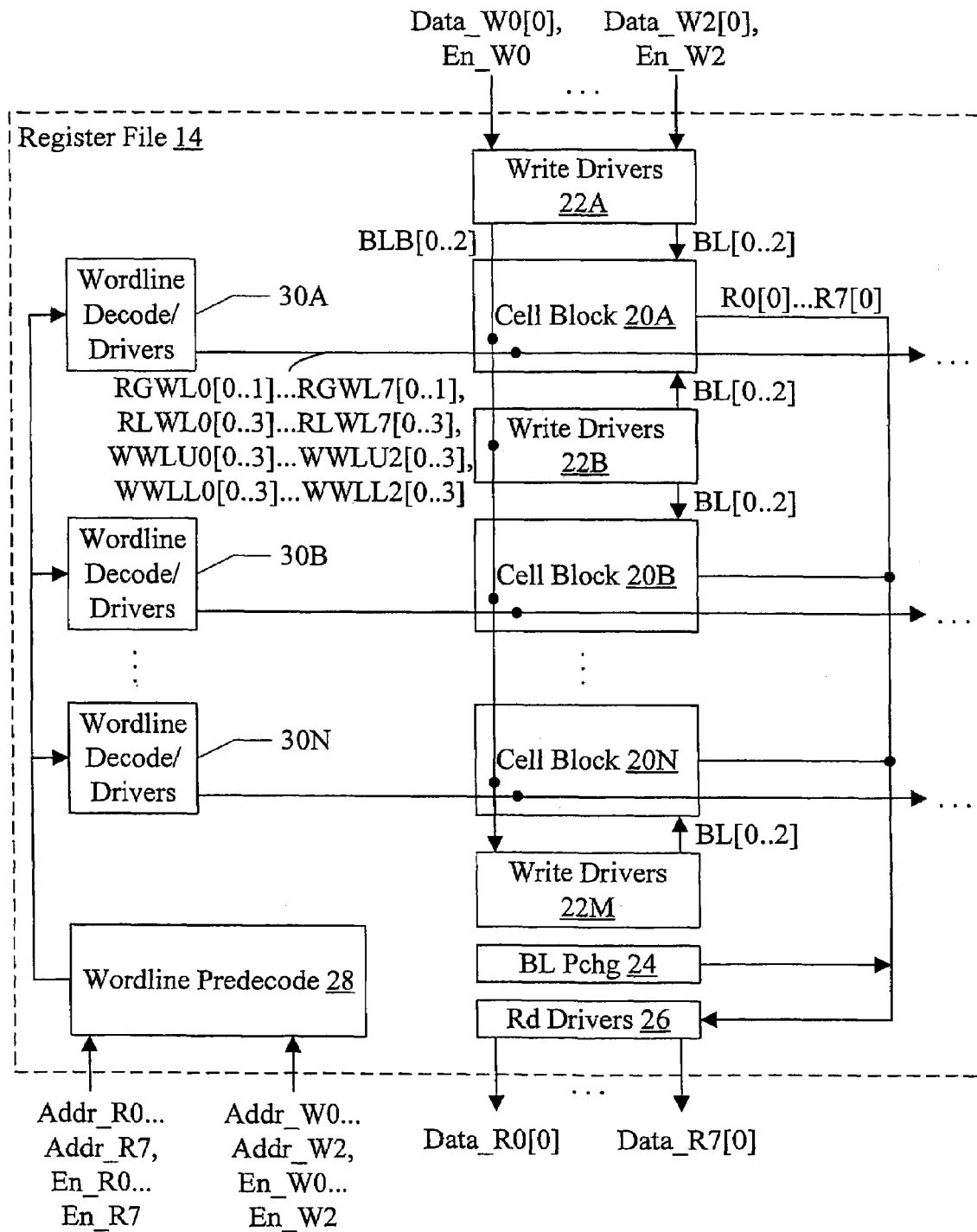
FIG. 2 is a block diagram of one embodiment of a register file shown in FIG. 1.
Figure 3:
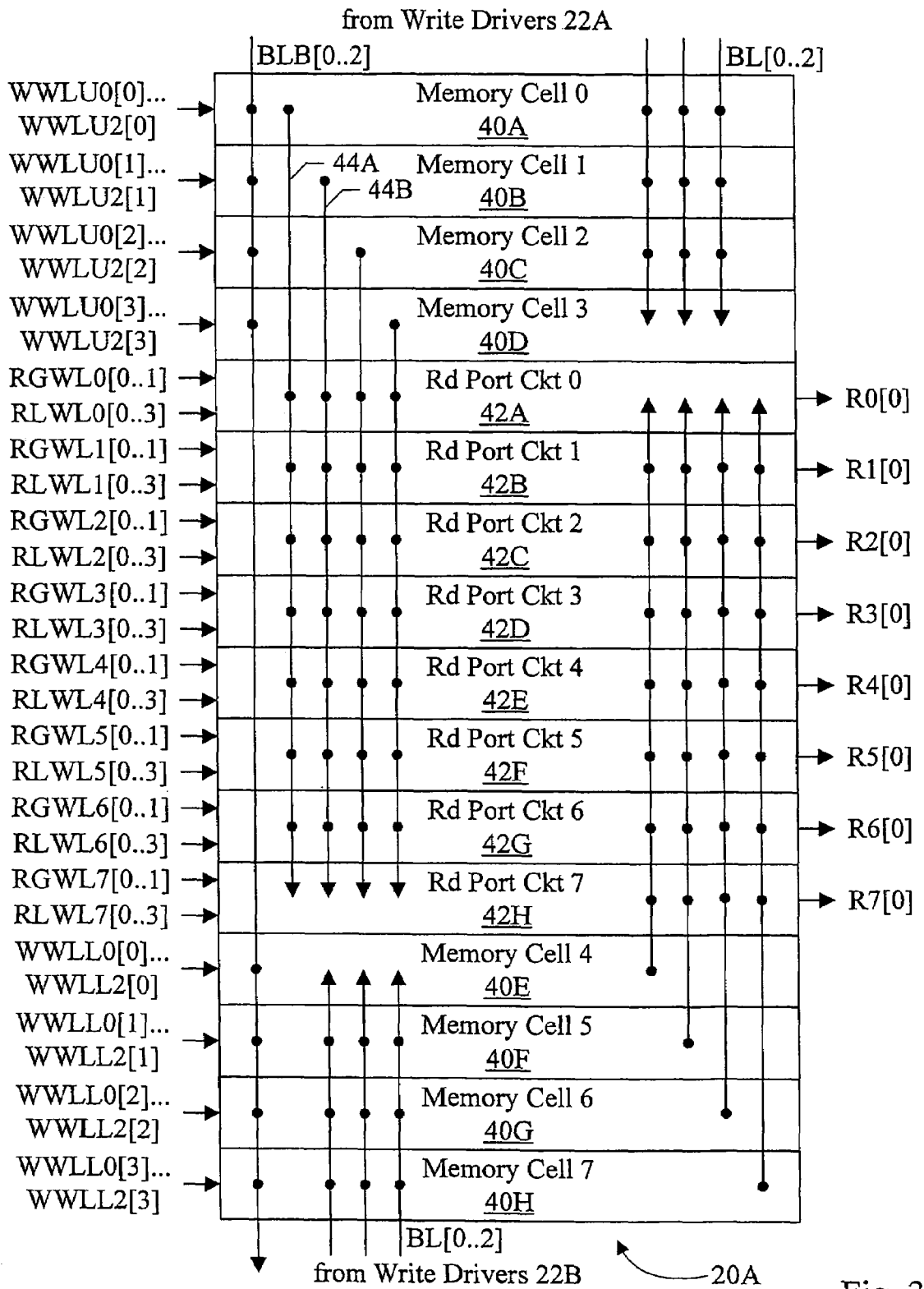
FIG. 3 is a block diagram of one embodiment of a cell block shown in FIG. 2.

In FIGS. 2 and 3 below, a dot is used where a signal line or lines crosses over a block to indicate that the signal line or lines make a connection in that block in addition to crossing over the block. An arrow head on a signal line or lines, on the boundary of a block or within a block, also indicates a connection of the signal line or lines to the block.

Turning now to FIG. 2, a block diagram of one embodiment of a portion of the register file 14 is shown. FIG. 2 illustrates one column of the register file 14 (particularly, bit position 0 of each entry). Other columns may be similar, and may implement other bit positions of a multibit-per-entry memory. In the illustrated embodiment, the column includes a plurality of cell blocks 20A-20N, sets of write drivers 22A-22M, a bitline precharge circuit (BL Pchg) 24, and read port output drivers (Rd Drivers) 26. The register file 14 further includes a wordline predecode circuit 28 and wordline decode/driver circuits 30A-30N.

The wordline predecode circuit 28 is coupled to receive the addresses and enables for the read and write ports, and is coupled to the wordline decode/driver circuits 30A-30N. The wordline decode/driver circuits 30A-30N may drive the wordline signals to each respective cell block 20A-20N. That is, the wordline decode/driver circuits 30A-30N are coupled to provide the wordlines to the respective cell blocks 20A-20N. Additionally, the wordline signals may be coupled to the respective cell blocks 20A-20N in other columns (not shown explicitly in FIG. 2, but indicated by ellipses). The wordlines for each read port in the illustrated embodiment include a pair of global wordlines (RGWLx[0 . . . 1], where x is the port number 0 to 7) and 4 local wordlines (RLWLx[0 . . . 3]). The write wordlines include 4 upper wordlines per write port (WWLUx[0 . . . 3], where x is the port number 0 to 2) and 4 lower wordlines per write port (WWLLx[0 . . . 3]). The use of the global and local read wordline signals will be described in more detail below.

The write drivers 22A are coupled to receive bit 0 of the write data for each write port and the corresponding enable, and are configured to generate the bitline bar (BLB) for bit 0 of each write port 0 to 2 if the write port is enabled (BLB[0 . . . 2]). Bitline bar is the complement of the bit (that is, it is driven low if the bit is a binary one). Additionally, the write drivers 22A generate the bitline for each write port for a portion of the cell block 20A (BL[0 . . . 2]). The bitline (BL) is the true value of the bit (that is, it is driven low if the bit is a binary zero). The cell block 20A is coupled to receive the bitlines BL[0 . . . 2] from the write drivers 22A. The write drivers 22B-22M are coupled to receive the bitline bar signals from the write drivers 22A and are configured to generate the bitlines (BL[0 . . . 2]) for portions of the cell blocks 20A-20N. For example, the write drivers 22B generate the bitlines for portions of the cell blocks 20A-20B, and the write drivers 22M generate the bitlines for a portion of the cell block 20N.

Each of the cell blocks 20A-20N are configured to output bit 0 for each read port on a set of global bitlines, labeled R0[0] . . . R7[0] in FIG. 2, to the read drivers 26 (more generally, Rx[0] where x is the read port number). The read drivers 26 drive the output bit 0 of each read port to the logic circuitry 12 (Data_R0[0] to Data_R7[0]). The bitline precharge circuit 24 is also coupled to the global bitlines R0[0] . . . R7[0] to precharge the bitlines between reads.

Each cell block 20A-20N may comprise a predetermined number of memory cells, as well as read port circuitry for each read port, as will be described in more detail with respect to FIG. 3. In the illustrated implementation, 8 memory cells are included in each cell block 20A-20N, although other embodiments may have more or fewer memory cells per cell block. In a standard memory circuit design, each memory cell would have its own wordline for each read port. In the illustrated embodiment, fewer wordlines may be generated then memory cells. For example, in an 8 memory cell implementation, 6 wordlines are provided per read port. Other embodiments may vary the number of wordlines (e.g. dependent on the read port circuitry design, the number of memory cells in the cell block, etc.). Having to route fewer wordlines per cell block may permit reduced area to be occupied by the register file 14, in some embodiments. For example, in one embodiment having eight memory cells per cell block and 6 wordlines per cell block, the height of the register file 14 may be reduced by 1/3 as compared to a conventional register file design that uses 9 wordlines. Thus, the area occupied by the register file 14 may be reduced by 1/3. Additionally, power consumption may be reduced, in some embodiments. For example, since the height of the register file 14 is reduced, the length of the bitlines may correspondingly be reduced, which may reduce power consumption in some embodiments. Furthermore, read latency may be reduced as a result of the reduced length of the bitlines, in some embodiments.

Together, the wordline predecode circuit 28 and the wordline decode/drivers 30A-30N may decode the addresses on each port to generate the corresponding wordlines to read/write the addressed entries in the register file 14 (assuming the port is enabled via assertion of the corresponding enable signal by the logic circuitry 12, in the illustrated embodiment). In some embodiments, the wordline predecode circuit 28 may perform all of the decode function, and the wordline decode/drivers 30A-30N may simply be driver circuitry to drive the wordlines across the load of the cell blocks 20A-20N in each column. In other embodiments, the wordline predecode circuit 28 may be eliminated and each wordline decode/driver 30A-30N may receive the addresses and enables for each port. In still other embodiments, the wordline predecode circuit 28 may perform a portion of the decode. For example, in one embodiment, the wordline predecode circuit 28 may decode the most significant bits of the addresses to determine which cell block 20A-20N is accessed, and may signal the corresponding wordline decode/driver 30A-30N. The corresponding wordline decode/drivers 30A-30N may receive the least significant bits of the addresses and may decode them to generate the wordlines. Other wordline decode/drivers 30A-30N may not assert wordlines in response to the address.

For each cell block 20A-20N in the present embodiment, 6 wordlines are provided per read port: 2 global wordlines (RGWLx[0 . . . 1]) and 4 local wordlines (RLWLx[0 . . . 3]). For read purposes, the memory cells in the cell block 20A-20N may be divided into subsets. The local wordlines select one of the memory cells from each subset, and the global wordlines select one of the subsets. The number of local wordlines and global wordlines may be varied from embodiment to embodiment.

In one embodiment, the least significant three bits of the address on a read port may select one of the eight memory cells in a cell block 20A-20N. The remaining most significant bits may select one of the cell blocks 20A-20N. More particularly, in one embodiment, the most significant of the least significant 3 bits may be used to generate the global wordlines, and the two remaining bits may be used to generate the local wordlines. Other embodiments may use the address bits in other groupings to select cell blocks and memory cells, and to generate global wordlines and local wordlines.

In one embodiment, there is a write wordline for each write port and for each memory cell in the cell block. That is, there are 8 write wordlines per cell block and per write port in the illustrated embodiment. The write wordlines are shown in upper and lower portions for each port, consistent with the embodiment of the cell block shown in FIG. 3 and described in more detail below.

It is noted that, while the present embodiment provides an enable for each read port, other embodiments may not include enables and a read may be performed each clock cycle (or each time that reads are initiated). Write ports may include an enable to avoid writing any entries in the register file 14 if no write is provided on the port.

The arrangement of the cell blocks 20A-20N and the write drivers 22A-22M in FIG. 2 may reflect the relative physical location of the circuitry with respect to each other, in one embodiment. Specifically, write drivers such as write drivers 22B may be provided between each pair of cell blocks 20A-20N. The write drivers 22B drive the bitlines to a portion of the memory cells in each of the cell blocks 20A-20N between which they are located. Such a placement may permit efficient routing, as illustrated in FIG. 3. Write drivers 22A and 22M may drive bit lines to portions of the memory dells near which they are locate (e.g. cell blocks 20A and 20N, respectively).

Turning now to FIG. 3, a block diagram of one embodiment of the cell block 20A is shown. Other cell blocks 20B-20N may be similar. In the illustrated embodiment, the cell block 20A includes memory cells 40A-40H and read port circuits 42A-42H. The memory cells 40A-40H are arranged into two groups, with the read port circuits 42A-42H between the two groups. That is, the relative location of memory cells and read port circuits in FIG. 3 is intended to represent the relative physical location of the memory cells and read port circuits in one embodiment. Each of the read port circuits 42A-42H is coupled to receive the respective global and local wordline signals (RGWLx[0 . . . 1] and RLWLx[0 . . . 3], as illustrated in FIG. 3) and are coupled to provide bit 0 of the respective read port on the global bitlines (Rx[0] as illustrated in FIG. 3). The memory cells 40A-40D are coupled to receive the write wordline upper signals for each write port (WWLUx[0 . . . 3], respectively, as shown in FIG. 3). Similarly, the memory cells 40E-40H are coupled to receive the write wordline lower signals for each write port (WWLLx[0 . . . 3], respectively, as shown in FIG. 3). The memory cells 40A-40H are coupled to receive the bitline bar (BLB) signals for each write port from the write drivers 22A, and the memory cells 40A-40D are also coupled to receive the bitline signals (BL) from the write drivers 22A. The memory cells 40E-40H are coupled to receive the bitline (BL) signals from the write drivers 22B. Each of the memory cells 40A-40H are coupled to provide the bit stored therein to each of the read port circuits 42A-42H. For example, the bit from memory cell 40A is provided on line 44A, the bit from memory cell 40B is provided on line 44B, etc.

Each of the read port circuits 42A-42H corresponds to one of the read ports in the register file 14, and includes the circuitry used to select a bit from one of the memory cells 40A-40H for output on the read port responsive to the wordline signals for that read port. By providing the bit from each memory cell 40A-40H to the read port circuits, the pair of bitlines used for each read port in the standard design may be eliminated in favor of a single bitline driven by the read port circuit 42A-42H, in the present embodiment. Additionally, senseamp circuits typically used to sense the differential between the pair of bitlines may be eliminated, in the present embodiment. Power consumption may thus be reduced, in some embodiments.

Additionally, since the circuitry that selects the memory cell to output a bit from the cell block 20A is separate from the memory cells themselves, adding read ports or removing read ports from a given register file design may not impact the memory cells themselves. Rather, read port circuits may be added or removed from between the memory cells, and may be coupled to receive the bits from the memory cells.

The read port circuit 42A's operation with respect to the read wordlines RGWL0[0 . . . 1] signals and RLWL0[0 . . . 3] will be described, and the operation of the other read port circuits 42B-42H may be similar with respect to their input wordline signals. The RLWL0 signals are used to select one of the memory cells 40A-40D and one of the memory cells 40E-40H. For a given read, the RLWL0 signals may be one hot (one signal is asserted and others are deasserted), and the memory cells 40A-40D and 40E-40H assigned to the asserted RLWL0 signal is selected. The RGWL0 signals may also be one hot, and may select either the upper group of memory cells 40A-40D or the lower group of memory cells 40E-40H to output its bit. Thus, the selected memory cell 40A-40H in the selected group outputs its stored bit on read port 0 (R0[0] in FIG. 3). More particularly, RLWL0[0] may be assigned to memory cells 40A and 40E; RLWL0[1] may be assigned to memory cells 40B and 40F; RLWL0[2] may be assigned to memory cells 40C and 40G; and RLWL0[3] may be assigned to memory cells 40D and 40H. RGWL0[0] may be assigned to memory cells 40A-40D, and RGWL0[1] may be assigned to memory cells 40E-40H. Similar assignments of memory cells to wordlines may also be made for the other read ports. Thus, the memory cell 40A may be read if RLWL0[0] is asserted and RGWL0[0] is asserted; the memory cell 40B may be read if RLWL0[1] is asserted and RGWL0[0] is asserted; the memory cell 40C may be read if RLWL0[2] is asserted and RGWL0[0] is asserted; the memory cell 40D may be read if RLWL0[3] is asserted and RGWL0[0] is asserted; the memory cell 40E may be read if RLWL0[0] is asserted and RGWL0[1] is asserted; the memory cell 40F may be read if RLWL0[1] is asserted and RGWL0[1] is asserted; the memory cell 40G may be read if RLWL0[2] is asserted and RGWL0[1] is asserted; and the memory cell 40H may be read if RLWL0[3] is asserted and RGWL0[1] is asserted.

The read port circuits in each cell block 20A-20N cooperate to provide the read port functionality across the register file 14. For example, the read port circuit 42A and similar read port circuits in other cell blocks 20B-20N may provide for the read of bit 0 from any entry of the register file 14. For a give read operation on read port 0, one of the read port circuit 42A and similar read port circuits in other cell blocks 20B-20N may output a bit on R0[0]. Other read port circuits in cell blocks 20A-20N in other columns provide for the read of other bit positions within the register file entry.

The lines 44A-44B and other lines providing the bits from the memory cells 40A-40H to the read port circuits 42A-42H in FIG. 3 may be representative of the physical routing of the conductors that carry the signals. Generally, in integrated circuit design, alternate wiring layers above the semiconductor substrate carry conductors in orthogonal directions. The conductors in a given layer are generally carried in "wiring tracks" that are provided with at least a minimum specified spacing (or "pitch") to provide enough insulation between the conductors and to reduce the short circuits that may occur due to manufacturing defects. The lines 44A-44B and other lines from the memory cells 40A-40D to the read port circuits 42A-42H need not extend beyond the read port circuit 42H in the downward direction as illustrated in FIG. 3. Similarly, lines carrying the bits from memory cells 40E-40H to the read port circuits 42A-42H need not extend beyond the read port circuit 42A in the upward direction as illustrated in FIG. 3. Accordingly, the same wiring tracks in which the conductors from the memory cells 40A-40D to the read port circuits 42A-42H are run may be used for the conductors for the BL lines from the write drivers 22B to the memory cells 40E-40H, as illustrated in FIG. 3. Similarly, the same wiring tracks in which the conductors from the memory cells 40E-40H to the read port circuits 42A-42H are run may be used for the conductors for the BL lines from the write drivers 22A to the memory cells 40A-40D, as illustrated in FIG. 3. Accordingly, the write drivers 22A may provide the BL bitlines for the write ports to the memory cells 40A-40D and the write drivers 22B may provide the BL bitlines for the write ports to the memory cells 40E-40H. Additionally, the write drivers 22B may provide the BL bitlines for the write ports to the memory cells 40A-40D of the cell block 20B. That is, write drivers 22A-22M that are located between two cell blocks 20A-20N may drive bitlines to 8 memory cells in the present embodiment (4 memory cells in each cell block). Write drivers 22A and 22M may provide drive the bitlines to the 4 memory cells on the same side of the cell block 20A and 20N as the write drivers 22A and 22M. Additional area reduction may be achieved, in some embodiments, through the sharing of wiring tracks.

In this embodiment, the memory cells 40A-40H implement the write port circuitry, and thus receive the write port wordlines as shown in FIG. 3. The memory cells 40A-40D receive the WWLUx wordlines, and the memory cells 40E-40H receive the WWLLx wordlines. For a given write port, the WWLUx and WWLLx wordlines may be one hot as a group. The wordlines are divided into upper and lower sections to correspond to the placement of the memory cells in FIG. 3, but may logically comprise a set of 8 one hot wordlines. The bit provided on the bitline bar (BLB) and bitline (BL) signals from the write drivers 22A-22B may be written to the memory cell selected by the asserted write wordline.

It is noted that, in some embodiments, one or more cell blocks may have fewer memory cells than other cell blocks, if desired. As mentioned previously, each cell block may have more or fewer memory cells than the eight shown in FIG. 3. Furthermore, more or fewer read port circuits may be provided based on the number of read ports on the register file 14. Generally, a memory cell may comprise any circuitry configured to store at least one bit and provide the at least one bit for reading. While each memory cell stores one bit in the illustrated embodiment, other memory cells may store more than one bit.

Figure 4:
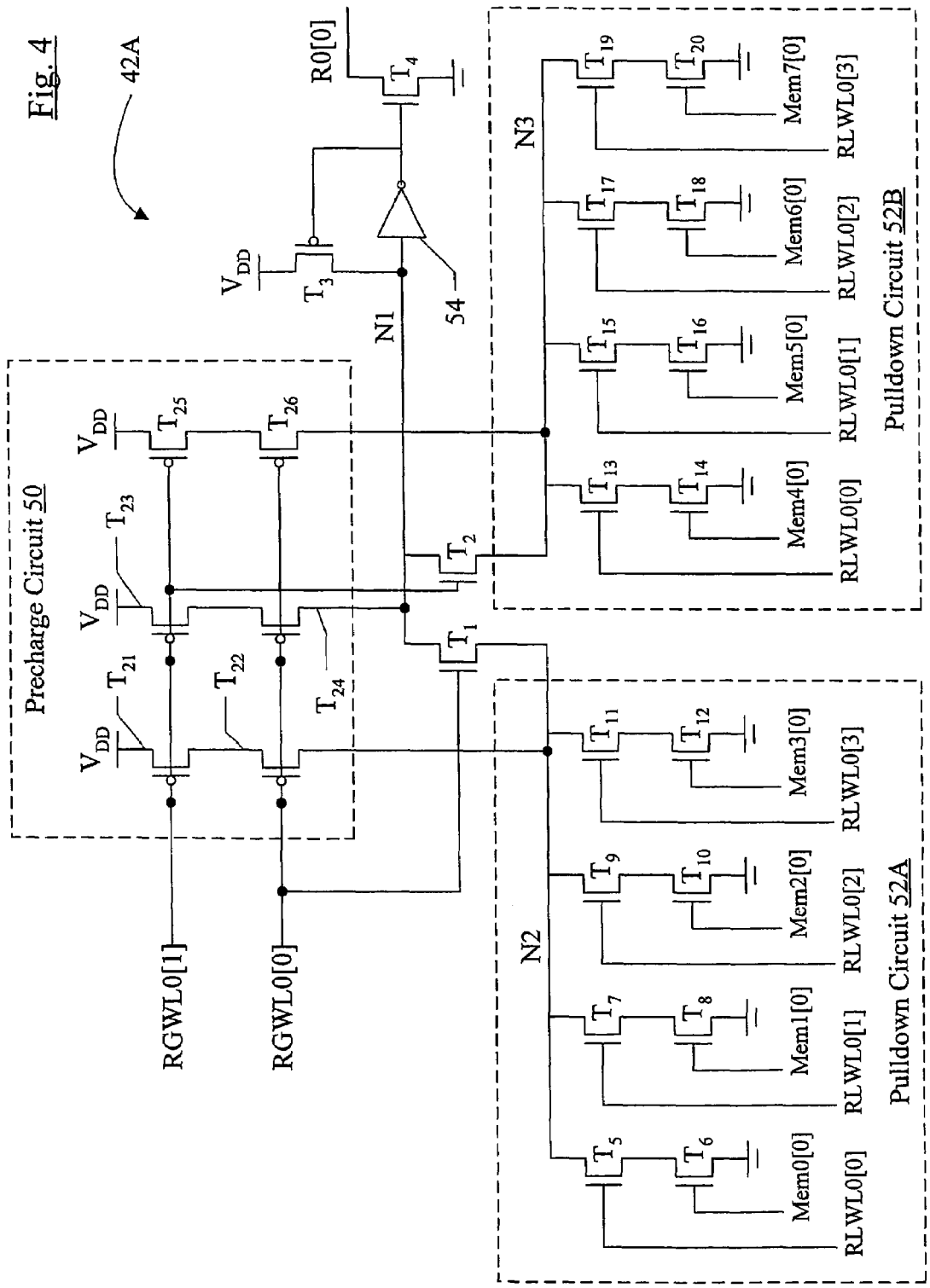
FIG. 4 is a circuit diagram of one embodiment of a read port circuit.

Turning now to FIG. 4, a circuit diagram of one embodiment of the read port circuit 42A is shown. The read port circuits 42B-42H may be similar. In the illustrated embodiment, the read port circuit 42A includes a precharge circuit 50, a pair of pulldown circuits 52A-52B, transistors $T_1$ and $T_2$, a keeper comprising inverter 54 and transistor $T_3$, and an output transistor $T_4$. The precharge circuit 50 is coupled to a node N1 (and also to internal nodes N2 and N3 in the pulldown circuits 52A-52B), and is coupled to receive the global wordline signals RGWL0[0 . . . 1]. The transistors $T_1$ and $T_2$ are coupled to the node N1 and to the pulldown circuits 52A-52B respectively (more particularly, to the nodes N2 and N3, respectively), and have gates coupled to receive the RGWL0[0 . . . 1] signals respectively. The node N1 is coupled to the input of the inverter 54, which has its output coupled to the gates of the transistors $T_3$ and $T_4$. The transistor $T_4$ is coupled to the global bitline R0[0] and to $V_{SS}$ (or ground). The transistor $T_3$ is coupled to $V_{DD}$ and to the node $N_1$. The pulldown circuits 52A-52B are coupled to receive the local bitlines RLWL0[0 . . . 3]. The pulldown circuit 52A is further coupled to receive data signals from the memory cells 40A-40D (shown as Mem0[0] to Mem3[0], respectively). The pulldown circuit 52B is further coupled to receive data signals from the memory cells 40E-40H (shown as Mem4[0] to Mem7[0], respectively). The data signals may indicate the value stored in each memory cell. For example, in the illustrated embodiment, the data signals may each be the value of the bit stored in the corresponding memory cell (as opposed to the complement of the value of the bit).

The node N1 is precharged by the precharge circuit 50 during a precharge phase of a clock cycle and is conditionally discharged during an evaluate phase of the clock cycle through the pulldown circuits 52A-52B, based on the bit stored in the memory cell that is selected for a read, if any. More particularly, the pulldown circuits 42A-42B may discharge their internal nodes N2 and N3 responsive to the assertion of a data signal from a memory cell and assertion of the corresponding local wordline. Discharge of node N1 through the node N2 or N3 may be controlled via assertion of the corresponding global wordline. If the selected memory cell is storing a binary one, in the illustrated embodiment, the pulldown circuit 52A-52B that receives the bit from the selected memory cell may discharge the node N1. Discharge the node N1 causes the output of the inverter 54 to transition to a binary one, which activates the transistor $T_4$. The transistor $T_4$ discharges the R0[0] bitline (which may be precharged by the bitline precharge circuit 24 shown in FIG. 2). Accordingly, in the present embodiment, a binary one in the selected memory cell is represented by a low voltage (binary zero) on the global bitline R0[0]. The read drivers 26 may drive a binary one on the output bit (Data_R0 [0]) in response to the binary zero on the global bitline R0[0]. If the selected memory cell is storing a binary zero, or if no memory cell in the cell block 20A is selected for reading on read port 0 (e.g. no read is transmitted, or another cell block 20B-20N has the selected memory cell), the node N1 is not discharged and the transistor $T_4$ is not activated. In the case that the selected memory cell is storing a binary zero, the pulldown circuit 52A-52B does not discharge the node N1. In the case that no memory cell in the cell block 20A is selected for reading, the global wordlines RGWL[0 . . . 1] may not be asserted. The transistors $T_1$ and $T_2$ may isolate the node N1 from the pulldown circuits 52A-52B in this case.

In the illustrated embodiment, the transistors $T_1$ and $T_2$ isolate or couple the pulldown circuits 52A-52B, respectively, from/to the node N1 responsive to the global wordline RGWL0[0 . . . 1] signals. Accordingly, the same set of local wordline signals RLWL0[0 . . . 3] may be used in each of the pulldown circuits 52A-52B to select a memory cell from the subset of memory cells coupled to the respective pulldown circuits 52A-52B. The global wordline signals may select the subset that includes the selected memory cell for read port 0, if any. Accordingly, the local wordline signals may be decoded, e.g., from the least significant bits of the address provided on read port 0. The same local wordline signals (or logically equivalent signals driven by separate circuitry) may be used in read port circuits similar to the read port circuit 42A in other cell blocks 20B-20N. The global wordline signals may be decoded from the remaining address bits. If the remaining address bits indicate a memory cell within the upper subset (memory cells 40A-40D), the global wordline RGWL0[0] may be asserted and the global wordline RGWL0[1] may be deasserted. If the remaining address bits indicate a memory cell within the lower subset (memory cells 40E-40H), the global wordline RGWL0[1] may be asserted and the global wordline RGWL0[0] may be deasserted. If the remaining address bits indicate a memory cell within another cell block 20B-20N both the global wordlines RGWL0[0 . . . 1] may be deasserted.

Accordingly, the illustrated embodiment of the read port circuit 42A uses six wordlines to access 8 memory cells. The reduced number of wordlines may, in some embodiments, reduce the area occupied by the read port circuit 42A (e.g. if the area is dominated by wiring to the circuit), as mentioned previously. Furthermore, completing the last stage of wordline decoding in the read port circuits (from the local wordlines and global wordlines, effectively performing a logical AND of the local wordlines and global wordlines) may reduce the latency of the wordline predecode circuit 28 and the wordline decoder/drivers 30A-30N, in some embodiments.

The pulldown circuits 52A-52B comprise series connections of pairs of transistors between their internal nodes N2 and N3, respectively, and ground (or $V_{SS}$). Each series connection corresponds to one of the memory cells. One of the transistors in the series connection has a gate coupled to receive the bit from the corresponding memory cell, and the other transistor in the series connection has a gate coupled to receive the local wordline corresponding to that memory cell. More particularly, the transistor that is connected to the node N2 may be controlled by the local wordline, to prevent the state of the bit from the memory cell from cause a charge sharing of the precharge on the node N2 with the node between the transistors in the series connection, in one embodiment. For example, the transistors $T_5$ and $T_6$ correspond to the memory cell 40A. The transistor $T_5$ has its gate coupled to the local wordline RLWL0[0] and the transistor $T_6$ has its gate coupled to the bit from the memory cell 40A. Similarly, the transistors $T_7$ and $T_8$ correspond to the memory cell 40B and the local wordline RLWL0[1]; the transistors $T_9$ and $T_{10}$ correspond to the memory cell 40C and the local wordline RLWL0[2]; and the transistors $T_{11}$ and $T_{12}$ correspond to the memory cell 40D and the local wordline RLWL0[3]. In the pulldown circuit 52B, the transistors $T_{13}$ and $T_{14}$ correspond to the memory cell 40E and the local wordline RLWL0[0]; the transistors $T_{15}$ and $T_{16}$ correspond to the memory cell 40F and the local wordline RLWL0[1]; the transistors $T_{17}$ and $T_{18}$ correspond to the memory cell 40G and the local wordline RLWL0[2]; and the transistors $T_{19}$ and $T_{20}$ correspond to the memory cell 40D and the local wordline RLWL0[3].

The precharge circuit 50, in the illustrated embodiment, includes series connections of transistors between $V_{DD}$ and the nodes N1, N2, and N3. Each series connection includes a transistor having its gate coupled to one of the global wordlines. For example, the series connection of transistors $T_{21}$, and $T_{22}$ are coupled to the node N2; the series connection of transistors $T_{23}$ and $T_{24}$ are coupled to the node N1; and the series connection of transistors $T_{25}$ and $T_{26}$ are coupled to the node N3. Thus, if each global wordline is deasserted, the nodes N1, N2, and N3 are precharged. Each of the global wordlines may be deasserted if another cell block 20B-20N includes the memory cell being read, if no read is performed on read port 0, and during the precharge phase of the register file 14. Accordingly, the global wordlines provide the precharge control to the read port circuit 42A. That is, the read port circuit 42A may be self precharged, and no clock signal may be required to control precharge in the cell blocks. Shielding that would normally be required around the clock signal routing may similarly be eliminated.

Additionally, the number of wordlines that may be asserted during a given read operation in the read port circuits may be limited to two (one local wordline and one global wordline). Accordingly, the Miller effect capacitance effect between wordlines may be limited since the number of transitioning wordlines that are near each other may be limited. In standard memory design, in which wordlines for each read port are routed together to each memory cell, many nearby wordlines may transition and cause Miller effect, and thus may require more shielding against Miller effect than some embodiments of the register file 14 may implement, in some embodiments.

It is noted that, while the illustrated embodiment of the pulldown circuits 52A-52B uses the value of the bit stored in each memory cell to pulldown (e.g. pulling down the node N1 if the value of the selected memory cell is a binary one), other embodiments may use the complement of the value (e.g. pulling down the node N1 if the value is a binary zero). In such embodiments, a pulldown on the R0[0] bit may represent a binary zero instead of a binary one, as described above.

The number of pulldown circuits 52A-52B may vary in various embodiments, depending on the number of memory cells to which the read port circuit 42A is coupled, the desired division of global and local wordlines, etc. In one embodiment, one pulldown circuit 52A-52B may be provided and the transistors $T_1$-$T_2$ and global wordlines may be eliminated (e.g. node N2 and node N1 may be the same node). Other embodiments may use more than two pulldown circuits 52A-52B, each coupled to the node N1 through a transistor similar to the transistors $T_1$-$T_2$ and controlled by a global wordline. Furthermore, the number of memory cells coupled to one pulldown circuit (and thus the number of local wordlines) may vary in various embodiments. Any number of two or more memory cells may be coupled to a pulldown circuit.

The illustrated embodiment includes complementary metal-oxide-semiconductor (CMOS) transistors. Specifically, in the illustrated embodiment, the transistors $T_3$ and $T_{21}$-$T_{26}$ may be p-type MOS (PMOS) transistors and the transistors $T_1$-$T_2$ and $T_4$-$T_{20}$ may be n-type MOS (NMOS) transistors. Other transistor types may be used in other embodiments.

Figure 5:
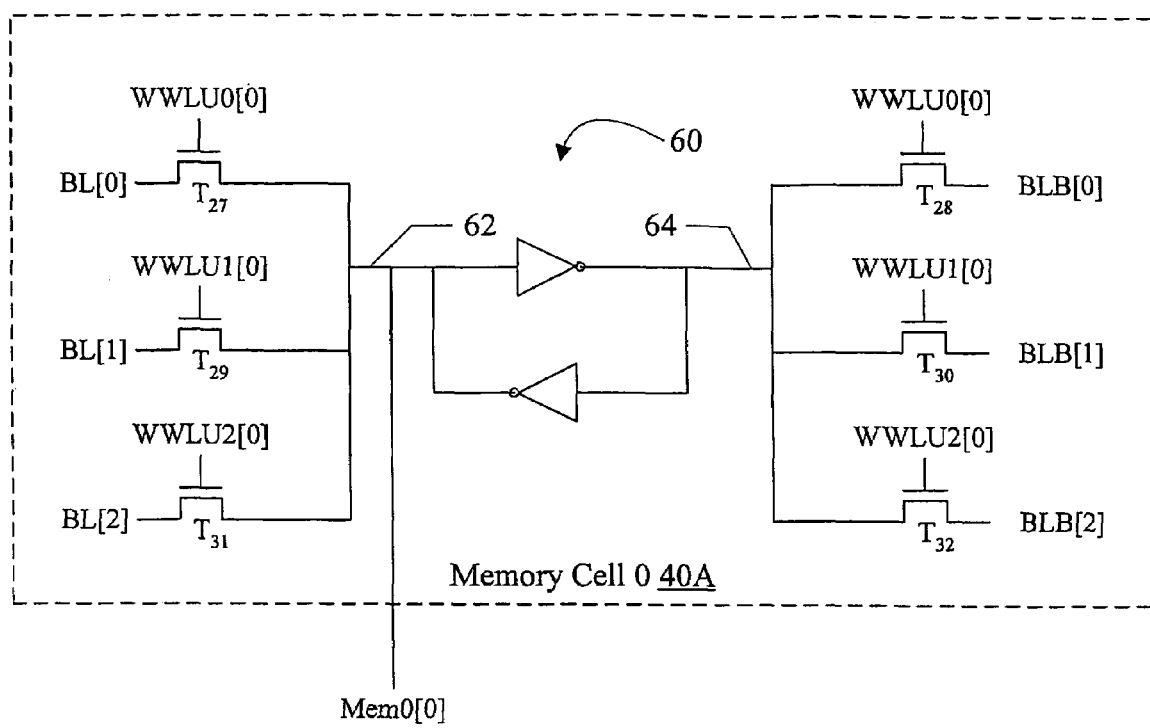
FIG. 5 is a circuit diagram of one embodiment of a memory cell.

Turning now to FIG. 5, a circuit diagram of one embodiment of the memory cell 40A is shown. Other memory cells 40B-40H may be similar. In the illustrated embodiment, the memory cell 40A may include cross-coupled inverters 60 forming a storage cell. In this embodiment, the true value of the bit is stored on the left side in FIG. 5 (node 62) and the complement of the bit is stored on the right side (node 64). Accordingly, the node 62 is coupled to the read port circuits to supply the bit from the memory cell 40A (Mem0[0], see FIG. 4). Additionally, for each write port, a pair of transistors may be used to coupled the nodes 62 and 64 to the bitline and bitline bar signals (BL and BLB, respectively) for that write port. Specifically, in FIG. 5, three write ports are provided. The transistors $T_{27}$ and $T_{28}$ are used to couple BL[0] and BLB[0] corresponding to write port zero under the control of write wordline signal WWLU0[0]; the transistors $T_{29}$ and $T_{30}$ are used to couple BL[1] and BLB[1] corresponding to write port one under the control of write wordline signal WWLU0[1]; and the transistors $T_{31}$ and $T_{32}$ are used to couple BL[2] and BLB[2] corresponding to write port two under the control of write wordline signal WWLU0 [2]. Other embodiments may support more or fewer write ports.

As illustrated in FIG. 5, the memory cell 40A does not included transistors for the read ports. Rather, the memory cell 40A is coupled to provide the stored bit to the read port circuits such as read port circuits 42A-42H. For the embodiment of FIG. 5, either logic circuit 12 or the wordline decode circuitry 28 and 30A-30N may ensure that only one write port is activated on a memory cell in a given write cycle, or that the data on the write ports is the same.

Numerous variations and modifications will become apparent to those skilled in the art once the above disclosure is fully appreciated. It is intended that the following claims be interpreted to embrace all such variations and modifications.

What is claimed is:

1. A memory circuit comprising:
   one or more first memory cells, each of the one or more first memory cells configured to store at least one bit;
   one or more second memory cells, each of the one or more second memory cells configured to store at least one bit; and
   two or more read port circuits physically located between the first memory cells and the second memory cells, wherein each of the read port circuits is coupled to receive both the at least one bit from each of the first memory cells and the at least one bit from each of the second memory cells, and wherein each of the read port circuits is configured to output the at least one bit from a selected memory cell of the first memory cells and the second memory cells responsive to a plurality of wordline signals coupled to the read port circuit.

2. The memory circuit as recited in claim 1 wherein the one or more first memory cells comprise a plurality of first memory cells and the one or more second memory cells comprise a plurality of second memory cells.

3. The memory circuit as recited in claim 2 wherein the plurality of wordline signals comprise a first plurality of wordline signals defined to select one of the plurality of first memory cells and one of the plurality of second memory cells.

4. The memory circuit as recited in claim 3 wherein the plurality of wordline signals further comprise a second plurality of wordline signals defined to select the selected memory cell from the one of the plurality of first memory cells and the one of the plurality of second memory cells.

5. The memory circuit as recited in claim 1 further comprising a write driver circuit configured to drive one or more bitlines to write one or more targeted memory cells of the first memory cells.

6. The memory circuit as recited in claim 5 further comprising a second write driver circuit configured to drive one or more second bit lines to write one or more targeted memory cells of the second memory cells.

7. The memory circuit as recited in claim 6 further comprising one or more third memory cells and one or more second read port circuits coupled to the third memory cells, wherein the second write driver circuit is configured to drive the second bit lines to write one or more targeted memory cells of the third memory cells.

8. The memory circuit as recited in claim 1 further comprising:
   one or more third memory cells, each of the one or more third memory cells configured to store at least one bit;
   one or more fourth memory cells, each of the one or more fourth memory cells configured to store at least one bit; and
   one or more second read port circuits physically located between the third memory cells and the fourth memory cells, wherein each of the second read port circuits is coupled to receive the at least one bit from each of the third memory cells and each of the fourth memory cells, and wherein each of the second read port circuits is configured to output the at least one bit from a selected memory cell of the third memory cells and the fourth memory cells responsive to a second plurality of wordline signals coupled to the second read port circuit.

9. The memory circuit as recited in claim 8 wherein the one or more second read port circuits are configured to output the at least one bit on bitlines on which the one or more read port circuits are also configured to output the at least one bit.

10. The memory circuit as recited in claim 1 further comprising wordline decode circuitry coupled to receive an address for each read port circuit and configured to decode the address to generate the plurality of wordline signals.

11. A memory circuit comprising:
one or more first memory cells, each of the one or more first memory cells configured to store at least one bit;
one or more second memory cells, each of the one or more second memory cells configured to store at least one bit;
one or more read port circuits physically located between the first memory cells and the second memory cells, wherein each of the read port circuits is coupled to receive the at least one bit from each of the first memory cells and each of the second memory cells, and wherein each of the read port circuits is configured to output the at least one bit from a selected memory cell of the first memory cells and the second memory cells responsive to a plurality of wordline signals coupled to the read port circuit; and
a write driver circuit configured to drive one or more bitlines to write one or more targeted memory cells of the first memory cells, wherein the one or more bit lines are routed in wiring tracks which are the same wiring tracks used to route the at least one bit of the second memory cells to the read port circuits.

12. An integrated circuit comprising:
logic circuitry configured to generate an address for a read port on a register file to read a location in the register file; and
the register file coupled to receive the address on the read port, wherein the register file comprises:
wordline decode circuitry coupled to receive the address and configured to decode the address to generate a plurality of wordline signals;
one or more first memory cells, each of the one or more first memory cells configured to store at least one bit;
one or more second memory cells, each of the one or more second memory cells configured to store at least one bit; and
two or more read port circuits physically located between the first memory cells and the second memory cells, wherein each of the read port circuits is coupled to receive both the at least one bit from each of the first memory cells and the at least one bit from each of the second memory cells, and wherein each of the read port circuits is configured to output the at least one bit from a selected memory cell of the first memory cells and the second memory cells responsive to the plurality of wordline signals coupled to the read port circuit.

13. The integrated circuit as recited in claim 12 wherein the one or more first memory cells comprise a plurality of first memory cells and the one or more second memory cells comprise a plurality of second memory cells.

14. The integrated circuit as recited in claim 13 wherein the plurality of wordline signals comprise a first plurality of wordline signals defined to select one of the plurality of first memory cells and one of the plurality of second memory cells.

15. The integrated circuit as recited in claim 14 wherein the plurality of wordline signals further comprise a second plurality of wordline signals defined to select the selected memory cell from the one of the plurality of first memory cells and the one of the plurality of second memory cells.

16. The integrated circuit as recited in claim 12 wherein the register file further comprises a write driver circuit configured to drive one or more bitlines to write one or more targeted memory cells of the first memory cells.

17. The integrated circuit as recited in claim 16 wherein the one or more bit lines are routed in wiring tracks which are the same wiring tracks used to route the at least one bit of the second memory cells to the read port circuits.

18. The integrated circuit as recited in claim 16 wherein the register file further comprises a second write driver circuit configured to drive one or more second bit lines to write one or more targeted memory cells of the second memory cells.

19. The integrated circuit as recited in claim 18 wherein the register file further comprises one or more third memory cells and one or more second read port circuits coupled to the third memory cells, wherein the second write driver circuit is configured to drive the second bit lines to write one or more targeted memory cells of the third memory cells.

20. The integrated circuit as recited in claim 12 wherein the register file further comprises:
one or more third memory cells, each of the one or more third memory cells configured to store at least one bit;
one or more fourth memory cells, each of the one or more fourth memory cells configured to store at least one bit; and
one or more second read port circuits physically located between the third memory cells and the fourth memory cells, wherein each of the second read port circuits is coupled to receive the at least one bit from each of the third memory cells and each of the fourth memory cells, and wherein each of the second read port circuits is configured to output the at least one bit from a selected memory cell of the third memory cells and the fourth memory cells responsive to a second plurality of wordline signals coupled to the second read port circuit.

21. The integrated circuit as recited in claim 20 wherein the one or more second read port circuits are configured to output the at least one bit on bitlines on which the one or more read port circuits are also configured to output the at least one bit.

22. A memory circuit comprising:
a first cell block comprising:
one or more first memory cells, each of the one or more first memory cells configured to store at least one bit;
one or more second memory cells, each of the one or more second memory cells configured to store at least one bit; and
one or more first read port circuits physically located between the first memory cells and the second memory cells, wherein each of the first read port circuits is coupled to receive the at least one bit from each of the first memory cells and the second memory cells, and wherein each of the first read port circuits is configured to output the at least one bit from a selected memory cell of the first memory cells and the second memory cells responsive to a plurality of wordline signals coupled to the first read port circuit;
a second cell block comprising:
one or more third memory cells, each of the one or more third memory cells configured to store at least one bit;

one or more fourth memory cells, each of the one or more fourth memory cells configured to store at least one bit; and one or more second read port circuits physically located between the third memory cells and the fourth memory cells, wherein each of the second read port circuits is coupled to receive the at least one bit from each of the third memory cells and the fourth memory cells, and wherein each of the second read port circuits is configured to output the at least one bit from a selected memory cell of the third memory cells and the fourth memory cells responsive to a plurality of wordline signals coupled to the second read port circuit; and one or more write driver circuits physically located between the first cell block and the second cell block and configured to drive one or more bitlines to write one or more memory cells of the second memory cells and the third memory cells.

23. The memory circuit as recited in claim 22 wherein the one or more bit lines to the first cell block are routed in wiring tracks which are the same wiring tracks used to route the at least one bit of the first memory cells to the first read port circuits.

24. The memory circuit as recited in claim 23 wherein the one or more bit lines to the second cell block are routed in wiring tracks which are the same wiring tracks used to route the at least one bit of the fourth memory cells to the second read port circuits.

* * * * *